United States Patent
Shieh et al.

(10) Patent No.: US 8,962,377 B2
(45) Date of Patent: Feb. 24, 2015

(54) PIXELATED IMAGER WITH MOTFET AND PROCESS

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: Cbrite Inc., Goleta, CA (US)

( * ) Notice: Subject to any disclaimer, the term of this patent is extended or adjusted under 35 U.S.C. 154(b) by 243 days.

(21) Appl. No.: 13/713,744

(22) Filed: Dec. 13, 2012

(65) Prior Publication Data
US 2014/0167046 A1    Jun. 19, 2014

(51) Int. Cl.
| | |
|---|---|
| H01L 21/00 | (2006.01) |
| H01L 31/20 | (2006.01) |
| H01L 31/0368 | (2006.01) |
| H01L 31/0376 | (2006.01) |

(52) U.S. Cl.
CPC ............ *H01L 31/20* (2013.01); *H01L 31/0368* (2013.01); *H01L 31/0376* (2013.01); *Y02E 10/50* (2013.01)
USPC ....... 438/73; 438/158; 257/292; 257/E21.414

(58) Field of Classification Search
None
See application file for complete search history.

(56) References Cited

U.S. PATENT DOCUMENTS 8,507,962 B2 *  8/2013  Anderson et al. ............. 257/292

* cited by examiner

*Primary Examiner* — Wensing Kuo
*Assistant Examiner* — Shaka White
(74) *Attorney, Agent, or Firm* — Robert A. Parsons; Michael W. Goltry; Parsons & Goltry

(57) ABSTRACT

A method of fabricating a pixelated imager includes providing a substrate with bottom contact layer and sensing element blanket layers on the contact layer. The blanket layers are separated into an array of sensing elements by trenches isolating adjacent sensing elements. A sensing element electrode is formed adjacent each sensing element overlying a trench and defining a TFT. A layer of metal oxide semiconductor (MOS) material is formed on a dielectric layer overlying the electrodes and on an exposed upper surface of the blanket layers defining the sensing element adjacent each TFT. A layer of metal is deposited on each TFT and separated into source/drain electrodes on opposite sides of the sensing element electrode. The metal forming one of the S/D electrodes contacts the MOS material overlying the exposed surface of the semiconductor layer, whereby each sensing element in the array is electrically connected to the adjacent TFT by the MOS material.

32 Claims, 8 Drawing Sheets

PIXELATED IMAGER WITH MOTFET AND PROCESS

FIELD OF THE INVENTION

This invention generally relates to imagers designed to receive external illumination and to convert the illumination to electrical signals and especially to large area imagers.

BACKGROUND OF THE INVENTION

Photodiode imagers are well known in the art and are used in a great variety of devices including for example digital cameras, infrared detectors or imagers, x-ray imagers, etc. Generally, large area imagers, such as infrared and x-ray imagers, present a different problem than small area imagers, such as digital cameras. For example, because of the large sensing areas the substrate must be larger and heavier and connecting lines are longer and thicker so that coupling capacitances become larger and more problematic. Crystalline wafer over large size also becomes expensive or impractical. For example, image array for a chest x-ray device requires area of 400 mm×450 mm size, while the largest Si wafer nowadays is a round disk 300 mm in diameter, which can only be fabricated into a chip 200 mm×250 mm. That is to say, other than the cost factor, the dimension with silicon wafer could be limited from certain applications.

In the fabrication of large area imagers, there are generally two approaches. A first approach is to fabricate the photodiode array first (i.e. on the substrate) and to fabricate the pixel TFT electronics later. A second approach is to do the pixel TFT electronics on the substrate and to fabricate the photodiode array later. In each of these approaches there are several problems including the direction of illumination, interaction between metal contacts, the number of process steps, etc.

It would be highly advantageous, therefore, to remedy the foregoing and other deficiencies inherent in the prior art.

Accordingly, it is an object of the present invention to provide a new and improved process for fabricating a pixelated imager with a metal-oxide thin film transistor (MOTFT) array.

It is another object of the present invention to provide a new and improved process for fabricating a pixelated imager using a fewer number of process steps.

It is another object of the present invention to provide a new and improved process for fabricating an imager in which coupling capacitance is substantially reduced.

It is another object of the present invention to provide a new and improved process for fabricating an imager in which the imager and MOTFET array interact to reduce the number of interconnections.

It is another object of the present invention to provide a new and improved process for fabricating large area imagers.

It is another object of the present invention to provide new and improved imagers and especially large area imagers.

It is another object of the present invention to provide a new and improved process for fabricating infrared imagers with more image pixels.

SUMMARY OF THE INVENTION

The desired objects of the instant invention are achieved in accordance with an embodiment of a method of fabricating a pixelated imager. The method includes providing a substrate with bottom contact layer and sensing element blanket layers deposited or grown on the bottom contact layer. The sensing element blanket layers are separated into an array of sensing elements with trenches isolating adjacent sensing elements in the array. A sensing element electrode is formed adjacent each sensing element in the array, each sensing element electrode overlying an isolating trench and defining a TFT. A layer of metal oxide semiconductor material is formed on a dielectric layer overlying the sensing element electrode of each TFT and on an exposed upper surface of the sensing element blanket layers defining the sensing element adjacent each TFT. A layer of source/drain metal is deposited on each TFT over an area surrounding the gate electrode and separated into electrodes on opposite sides of the gate electrode. The metal forming one of the source/drain electrodes is in electrical contact with the metal oxide semiconductor material overlying the exposed upper surface of the upper semiconductor layer of the adjacent sensing element. Whereby, each sensing element in the array is electrically connected to the adjacent TFT by the metal oxide semiconductor material.

The desired objects of the instant invention are further achieved in accordance with a specific method of fabricating a pixelated imager including the steps of providing a substrate, forming a bottom electrode layer on the substrate, and depositing at least a lower semiconductor layer and an overlying upper semiconductor layer on the bottom electrode to form a p-n junction blanket layer overlying the bottom electrode layer. The method further includes using a first masking step to separate the upper semiconductor layer of the p-n junction blanket layer into an array of photodiodes with trenches isolating adjacent photodiodes in the array and planarizing the array of photodiodes with a dielectric material. A second masking step is used to form a gate electrode defining a TFT adjacent each photodiode of the array of photodiodes with each of the gate electrodes overlying an isolating trench. A layer of gate dielectric is deposited on the photo diode array and using a third masking step portions of the layer of gate dielectric are removed to expose an upper surface of the upper semiconductor layer of each photodiode in the array of photodiodes. A fourth masking step is used to deposit a layer of metal oxide semiconductor material on the gate dielectric layer overlying the gate electrode of each TFT and the exposed upper surface of the upper semiconductor layer of each photodiode in the array of photodiodes. A fifth masking step is used to deposit a layer of etch stop material overlying the gate electrode of each TFT and the layer of metal oxide semiconductor material overlying the exposed upper surface of the upper semiconductor layer of each photodiode. A sixth masking step is used to deposit a layer of source/drain metal on each TFT over an area surrounding the gate electrode and separate the layer of source/drain metal into electrodes on opposite sides of the gate electrode. The metal forming one of the source/drain electrodes is in electrical contact with the metal oxide semiconductor material overlying the exposed upper surface of the upper semiconductor layer of the adjacent photodiode.

The desired objects of the instant invention are also achieved in accordance with a specific embodiment thereof wherein a structure including a pixelated imager is provided. The structure includes a substrate with a bottom contact layer and sensing element blanket layers deposited on the bottom contact layer. The sensing element blanket layers are separated into an array of sensing elements with trenches isolating adjacent sensing elements in the array. A gate electrode is positioned adjacent each sensing element in the array with each gate electrode overlying an isolating trench and defining a TFT. A layer of metal oxide semiconductor material is positioned on a gate dielectric layer overlying the gate electrode of each TFT and on an exposed upper surface of the sensing element blanket layers defining the sensing element adjacent each TFT. A layer of source/drain metal is positioned on each TFT over an area surrounding the gate electrode and separated into electrodes on opposite sides of the gate electrode. The metal forming one of the source/drain electrodes is in electrical contact with the metal oxide semiconductor material overlying the exposed upper surface of the upper layer of the adjacent sensing element, whereby each sensing element in the array is electrically connected to the adjacent TFT by the metal oxide semiconductor material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

In the present invention the TFT electronics are fabricated directly on the photodiode array. Basically, the illumination can be from the top or the bottom. For example, if the substrate of photodiodes is not transparent, e.g. germanium or silicon photodiodes, the illumination can only come from the top. In the present description, top illumination is described for convenience. In a typical example, the scintillator film for an x-ray imager (film that converts x-rays to visible rays) is laminated to the top surface instead of to the bottom surface. This arrangement is due to the fact that the substrate separates the scintillator film from the detector and the thickness of the substrate can reduce the resolution.

Also, with top illumination, a transparent top electrode is required for the photodiodes array. In a typical a-Si or poly-Si TFT, the transparent electrode requires one or more extra steps to deposit a transparent conductor, such as indium-tin-oxide (ITO). Another, issue with the bottom photodiode approach is the coupling capacitance of the data and gate lines to the photodiode common electrode. To reduce or substantially eliminate this capacitance a thick low k dielectric must be positioned between the data and gate lines and the photodiode common electrode. In the prior art including the thick dielectric required additional process steps.

Figure 1:
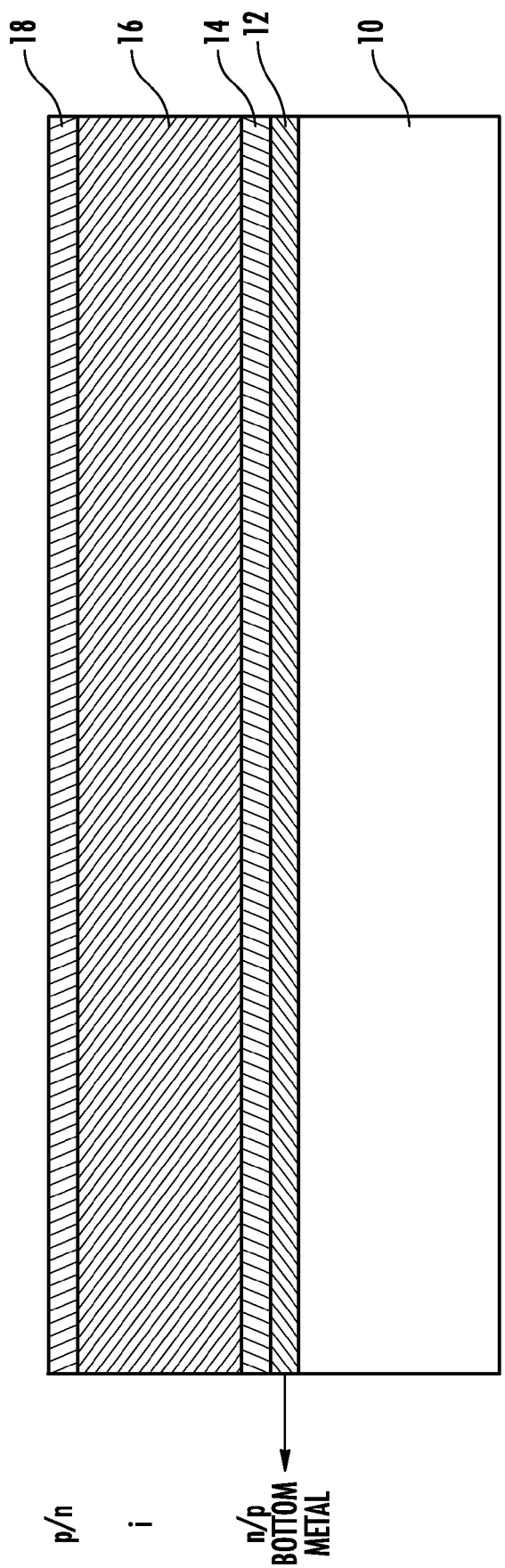
FIGS. 1 through 7 show simplified layer diagrams illustrating intermediate structures in a simplified process for fabricating imagers in accordance with the present invention.

Referring specifically to FIG. 1, a substrate 10 is illustrated with a bottom metal electrode 12 formed thereon. As will be understood from the following description, bottom metal electrode 12 is a common electrode for a photodiode array fabricated thereon. In many cases, a non-patterned metal or doped semiconductor electrode can be used. In some special cases for high pixel counts, or for further reducing the capacitive coupling between the bottom common electrode and the top column/row electrode lines. The bottom common electrode can be patterned in two-dimensional grid form so as to leave most of the area underneath the top column/row grid electrode lines open. For simplicity and explicitly, bottom electrode 12 in FIG. 1 is drawn in continuous form reflecting either un-patterned form, or in the continuous area in patterned form. The corresponding mask step is not counted in the following process flow.

A first semiconductor layer 14 is deposited on electrode 12 and may be either n or p type conductivity. A layer 16 of intrinsic semiconductor material is deposited on layer 14 and a layer 18 of opposite conductivity material (i.e. p or n) is deposited on layer 16. It will be understood that the three layers form a sensing element or in this case a PIN diode detector (photodiode), which is a preferred embodiment for its efficiency. However, if simple p/n diodes are sufficient, intrinsic layer 16 can simply be omitted. In either process, layers 12, 14, 16, and 18 are contact and p-i-n photodiode blanket layers, or sensing element blanket layers, deposited over substrate 10 and no masks are required.

The sensing element blanket layers can be in either crystalline or amorphous form. Examples of materials that can be included in the sensing element blanket layers in the p-i-n stacks include silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or their combinations in either amorphous or crystalline form. Take crystalline germanium, or Ge—Si alloy as an example, doped crystal can be used as the substrate directly, the insulating i layer can be formed by de-doping or by reverse-doping with opposite valance elements. For the visible image array, amorphous silicon (a-Si) p-i-n stack can be formed directly by PECVD process.

In addition to (or instead of) the p-i-n photodiode array, other sensing elements can be formed with a sensing function layer sandwiched between the top and bottom electrodes. For example, a thermal image array can be formed with a thermoelectric layer in the sensing area. In another example, a large size, ultrasonic sound wave detector array can be formed when a piezoelectric layer is used between the top and bottom electrodes. Also, as mentioned above, a scintillator film for an x-ray imager can be formed in the sensing area.

Figure 2:
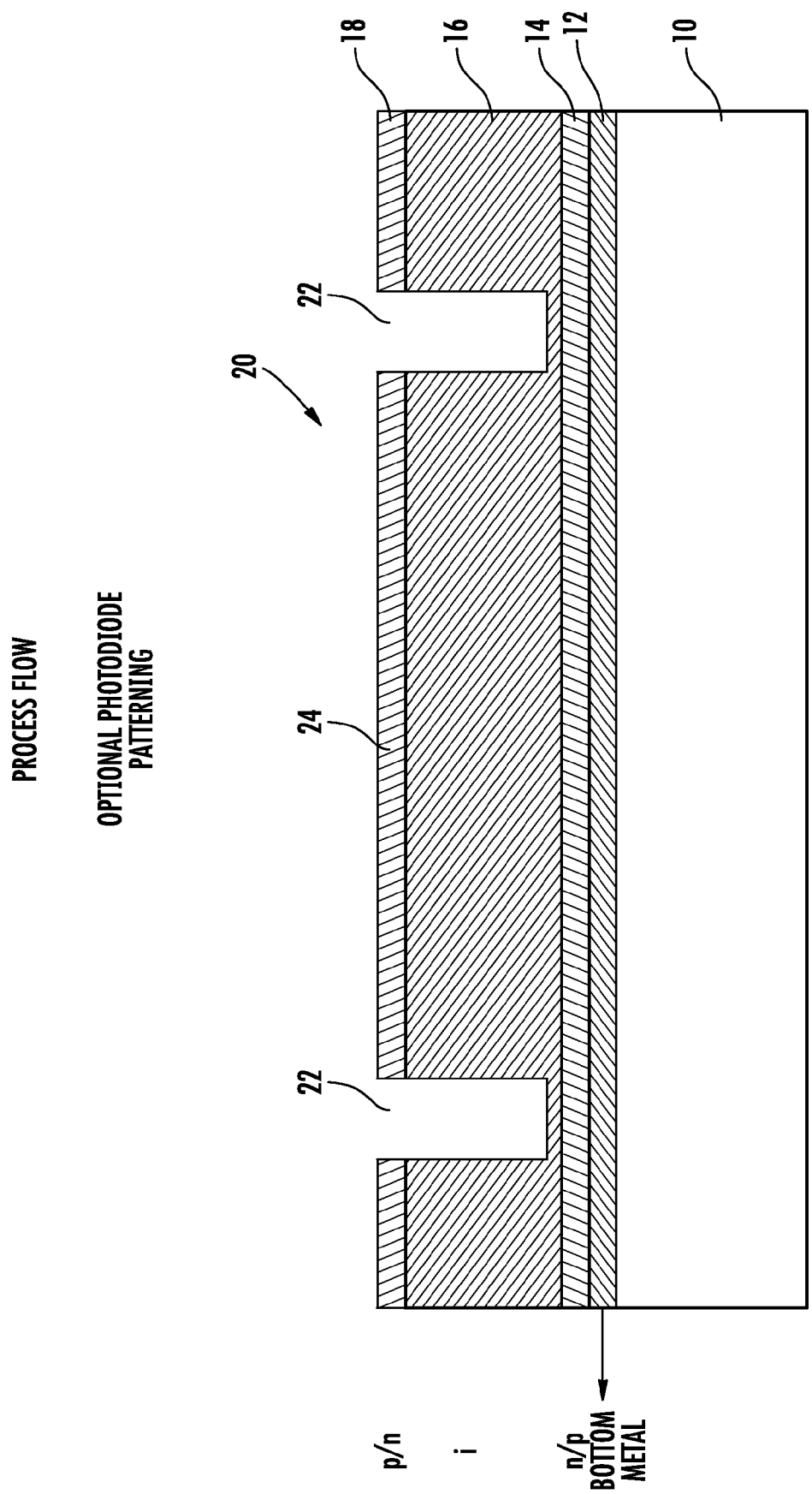
Figure 3:
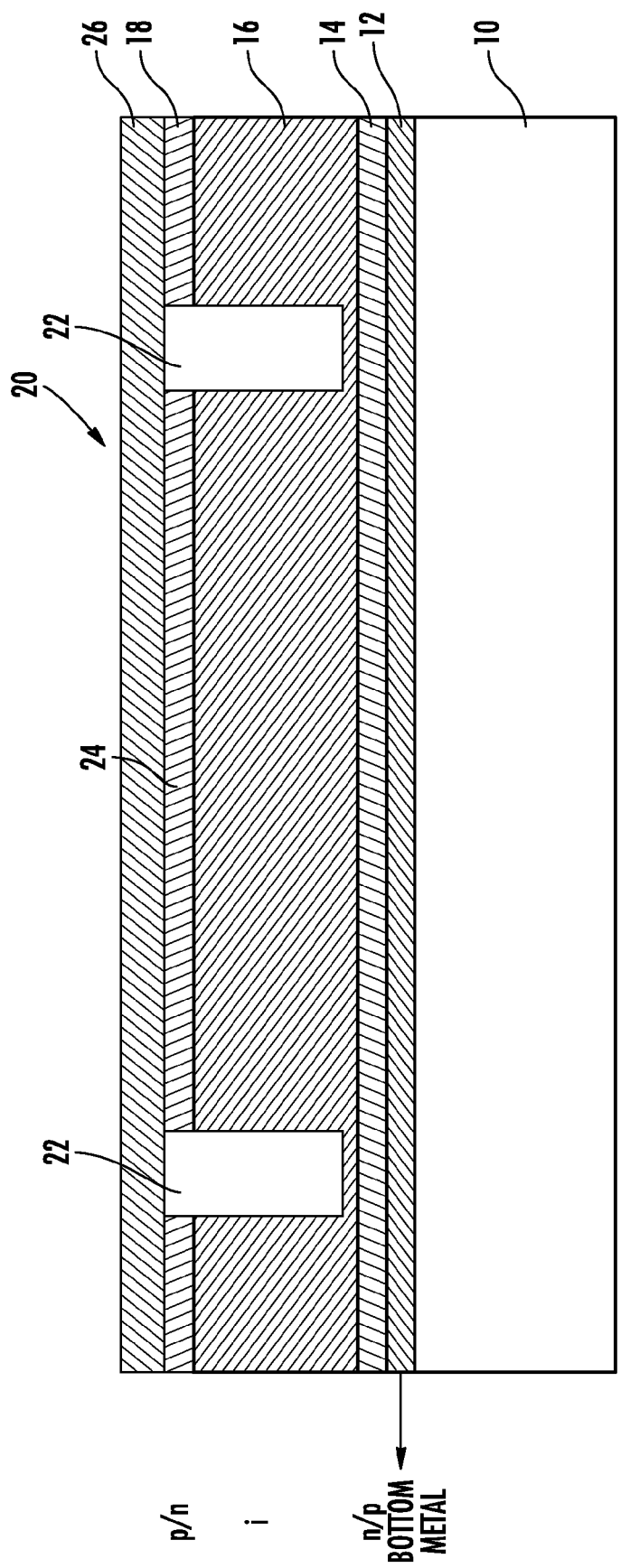

Turning to FIG. 2, the structure illustrated and described in conjunction with FIG. 1 is patterned (first mask step) into an array of individual PIN diodes with separate top contacts. In this process deep trenches 22 are etched through layer 18 and layer 16 for isolation but the etching stops short of layer 14 in this embodiment. In the present illustration only one photodiode 20 (sensor element) of the array will be shown in its entirety for simplification of the drawings and disclosure. Photodiode 20 has a top contact 24. As illustrated in FIG. 3, the structure is planarized with a coating 26 of low k dielectric material (with a dielectric constant below approximately 6 and preferably below approximately 4). Examples of low k dielectric material that can be processed by a coating process (such as spin coating, slot coating, spray coating, etc.) include polymer PMGI, polystyrene, PMMA, or other type acrylic polymer, Polyethylene, polyimide, polyvinyl phenol (PVP), zeon, PET, PEN, PES, PAN, BCB, SU8, silane- or siloxy-lane based, metallo-organic based (such as magnesium-based, or copper-based) compounds, spin on glasses, grapheme oxides and other combinations in blend or multi-layer form. It will be noted that trenches 22 are formed as deep as practical in this preferred embodiment (only upper layer 18 could be etched to separate the photodiodes) so that the low k dielectric material is very thick in the trench area. The method of patterning such low k material is well known to experts in the field, either wet-etching or dry-etching can be used.

Figure 4:
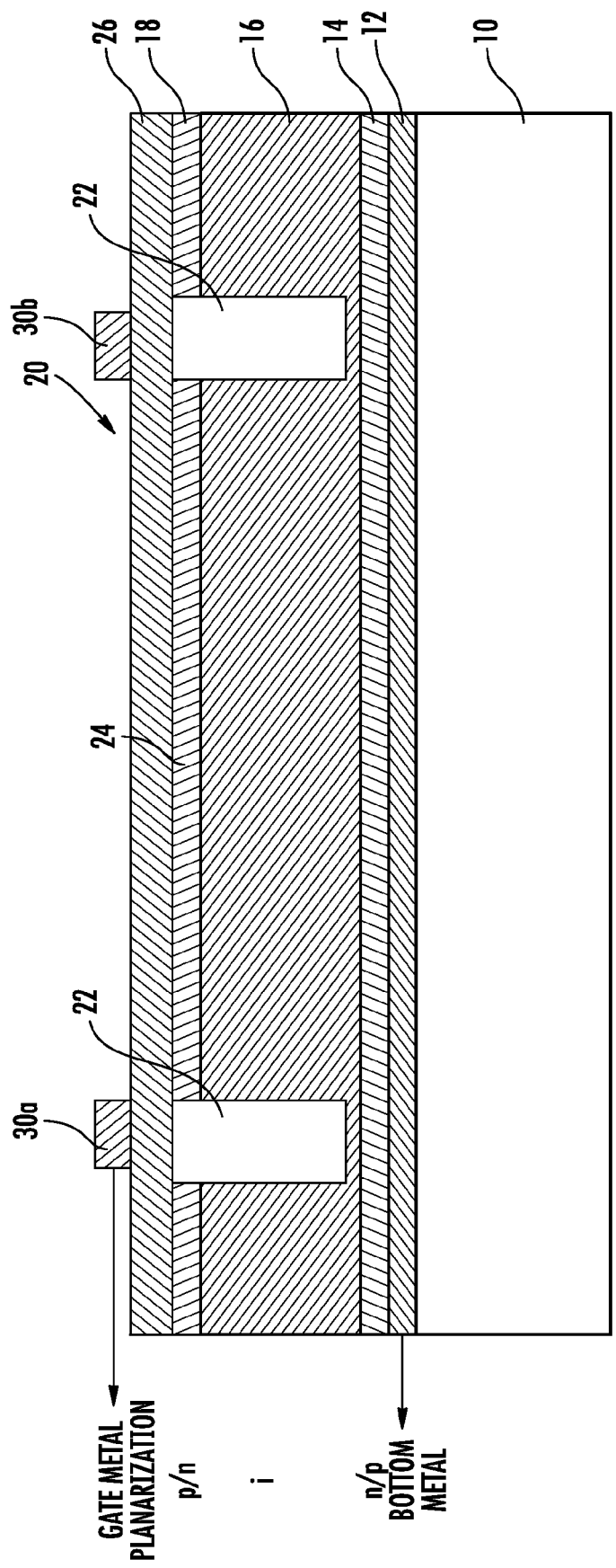

Referring additionally to FIG. 4, gate metal 30 is deposited and patterned ($2^{nd}$ mask step) onto planarizing coating 26. Here it should be understood that gate electrodes, designated 30a in FIG. 4, are deposited on the array with one each defining a TFT in conjunction with each photodiode in the array. Also, gate lines and data lines, represented by 30b in FIG. 4, are deposited in overlying relationship to trenches 22.

The gate lines and the data lines are positioned over trenches 22 so that the thick low k dielectric material 26 substantially reduces coupling capacitance between gate metal 30 and bottom or common contact 12.

Figure 5:
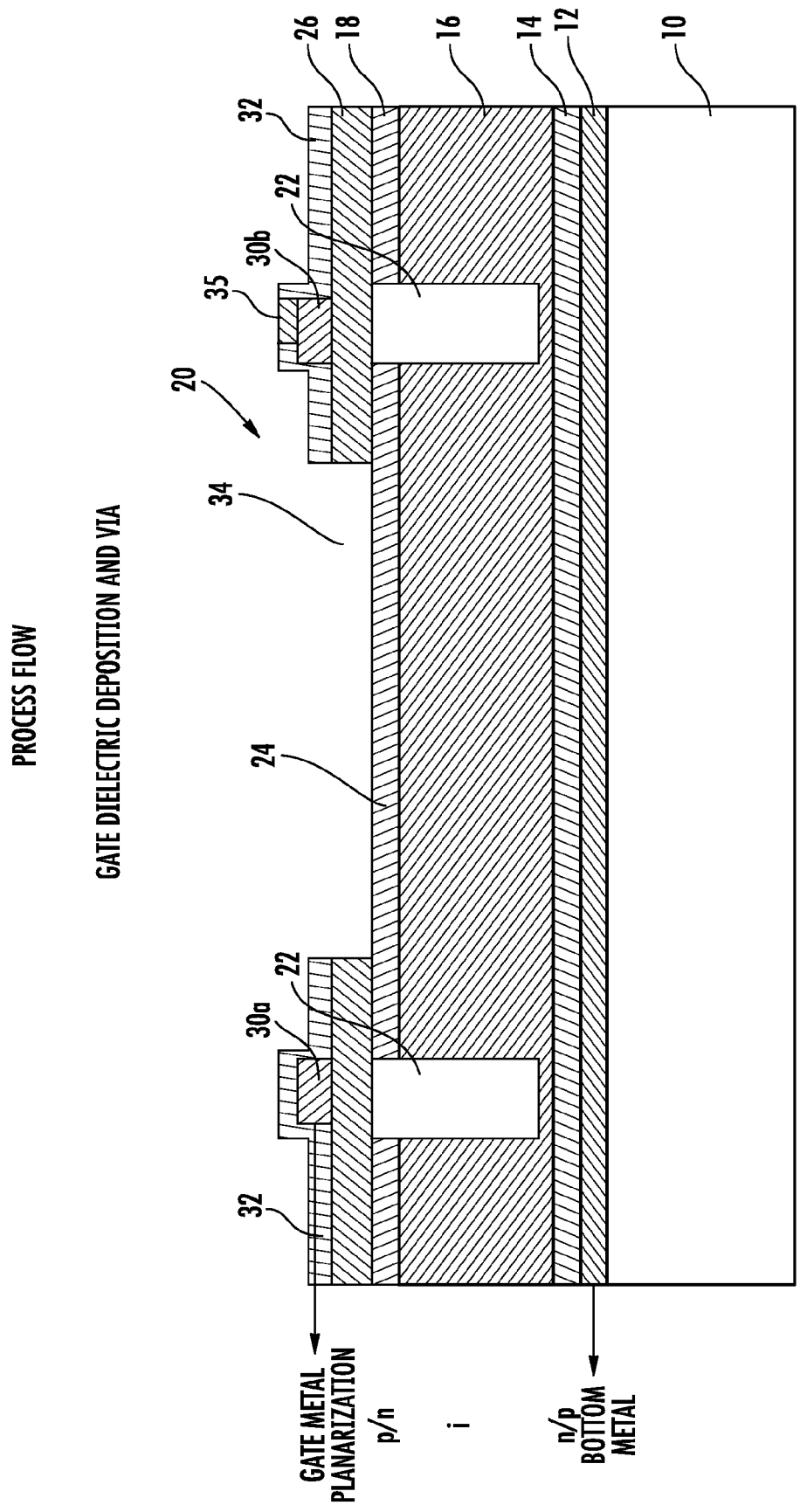

Referring now to FIG. 5, a blanket gate dielectric layer 32 is deposited over the structure. Vias 34 are opened through gate dielectric layer 32 and through planarizing coating 26 to expose an upper surface of top contact 24 of photodiode 20 and each of the other photodiodes in the array. This is the third masking step in the process. It should be noted that an opening or via, designated 35, can also be provided in this third masking step to the adjacent line 30 to provide for external connections that will be shown later and understood from the description.

Figure 6:
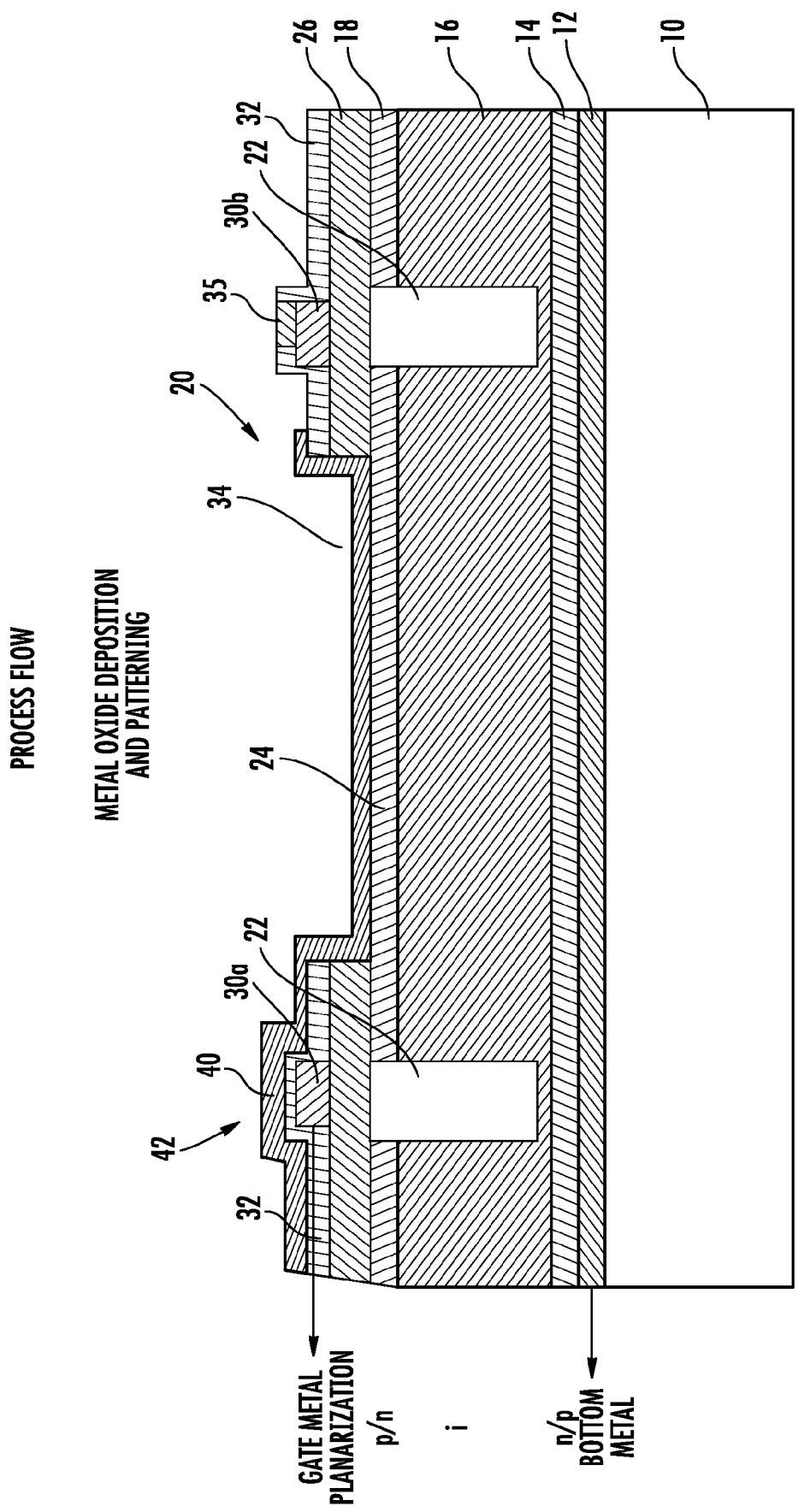

Referring to FIG. 6 a metal oxide semiconductor layer 40 is deposited as a blanket layer and patterned ($4^{th}$ mask step) to form the channel for a TFT 42 and to overlie and contact the top contact 24 of photodiode 20. Metal oxide layer 40 is transparent to the radiation wavelengths sensed by the photodiodes. Some typical examples of transparent metal oxides include ZnO, InO, AlZnO, ZnInO, InAlZnO, InGaZnO, InSnZnO, ZnSnO, GaSnO, InGaCuO, InCuO, CuZnO, GaCuO, GaZnO, AlCuO, etc. and their combinations. The, metal oxide semiconductor layer 40 may be in either amorphous or polycrystalline form. However, amorphous or nanocrystalline (grain size substantially smaller than TFT dimensions is preferred for uniformity of the image array.

Figure 7:
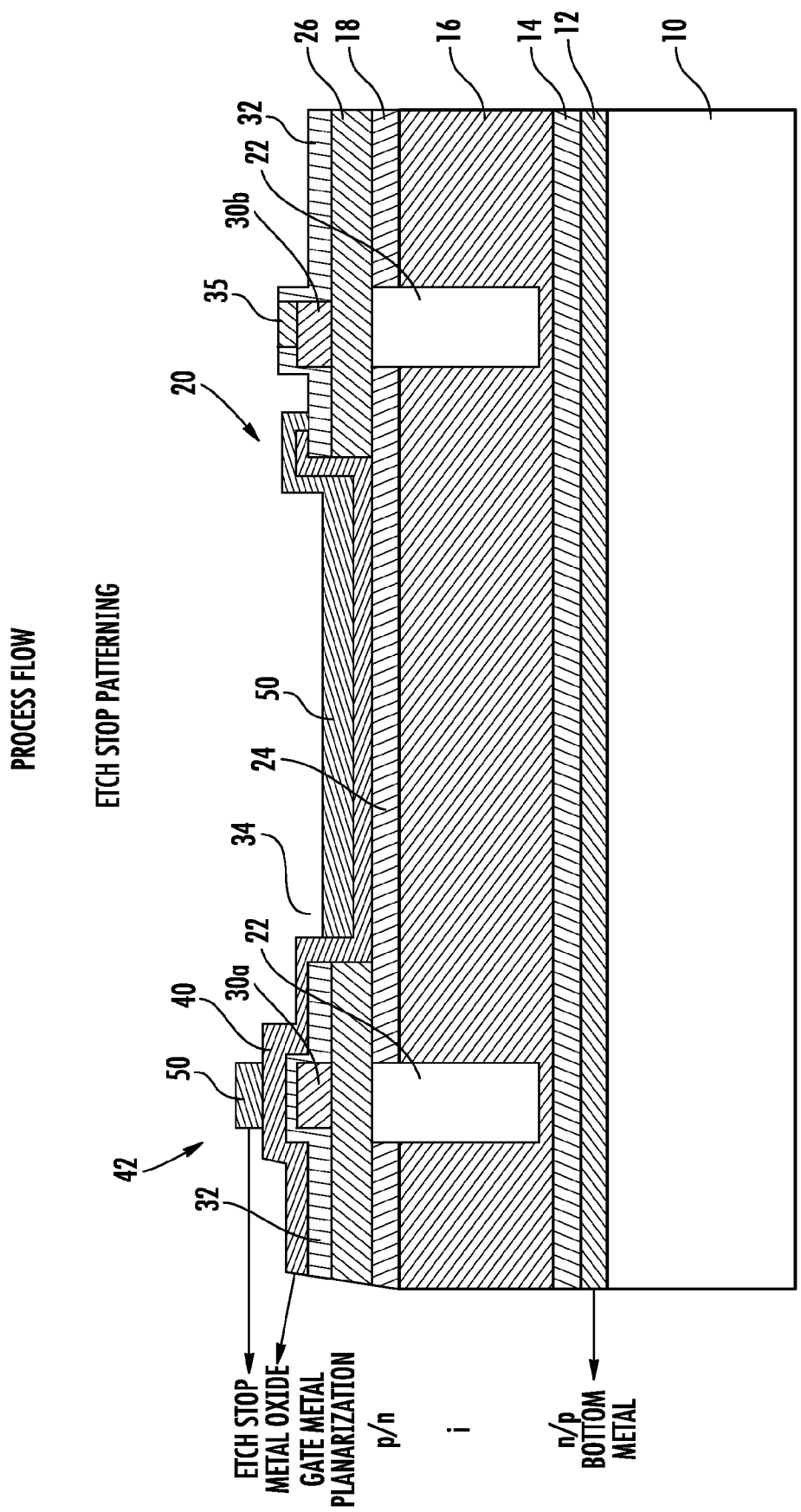
Figure 8:
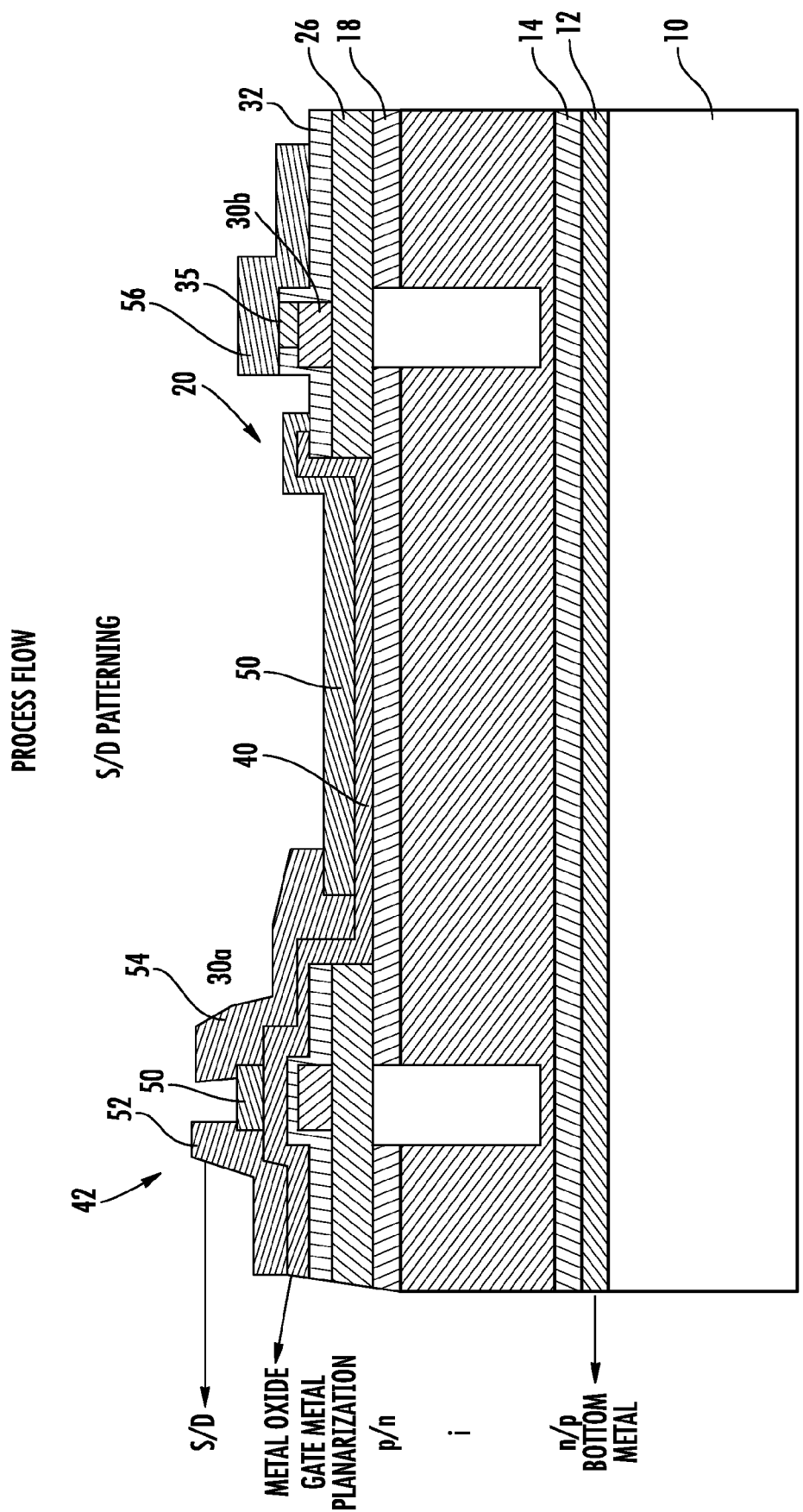
FIG. 8 is a simplified layer diagram illustrating the final imager in accordance with the present invention.

Turning to FIG. 7, an etch stop layer 50 is blanket deposited and patterned ($5^{th}$ mask step) to overlie gate 30 of TFT 42 and to overlie a major portion of top contact 24 of photodiode 20. Etch stop layer 50 is formed to define an active area in the metal oxide semiconductor material overlying gate electrode 30a. A blanket source/drain metallization layer is then deposited on the structure and patterned ($6^{th}$ mask step) to separate the metal layer into source/drain contacts 52/54 on opposite sides of the active area and to form a contact 56 with the adjacent gate line 30 through via 35. Etch stop layer 50 allows etching of the metallization layer without damaging metal oxide layer 40. In an alternative process to the TFT with an etch stop layer on top of the channel, the TFT can be made with a so-called back channel etching (BCE) method (sometimes referred to as "selective etching") by the proper selection of the channel material and the S/D etching process. That is by selecting the various materials the metallization layer can be etched without damaging metal oxide layer 40 and the extra step of patterning an etch stop layer can be eliminated.

Here it should be noted that metal oxide layer 40 serves as a transparent contact layer between TFT 42 and PIN diode 20. The transparent contact (metal oxide layer 400 between TFT 42 and photodiode 20) is defined by the metal oxide etch mask ($4^{th}$ mask step), the etch stop mask ($5^{th}$ mask step), and the S/D metallization etch mask ($6^{th}$ mask step). Thus, no additional deposition or masking steps are required to define the transparent top electrode of photodiode 20. It should also be noted that the portion of transparent contact layer (metal oxide layer 40) between TFT 42 and PIN diode 20 mostly overlies layer 18. Layer 18 has a tendency to absorb oxygen from metal oxide layer 40, thereby increasing the conductivity (carrier density) to render that portion of metal oxide layer 40 an electrical conductor (rather than a semiconductor). The portion of metal oxide layer 40 overlying the gate contact is adjacent gate dielectric layer 32, which does not effect the conductivity (i.e. absorb oxygen) so that the portion of metal oxide layer 40 defining the channel of TFT 42 remains a semiconductor.

Optional filters, micro-lens, or passivation layers can be deposited or laminated on top of the sensor element array. Some examples of a thin film passivation layer include Al2O3, MgO, SiO2, SiN, or PbO, which can be formed by either sputter, or chemical vapor deposition (CVD). In the case of a high energy radiation detector array, a passivation layer with heavy elements in the periodic table (such as PbO) could be used as thin passivation as well as a radiation blocker. Transmission enhancement can also be achieved with a MgO layer, or a low k dielectric layer. An optical micro-lens array on top of each sensing element can be formed with a transparent material using a proper patterning and etching process.

Although a single TFT is used in describing the process disclosed, sensor pixel circuits with multiple TFTs and more business can be designed with the same principle. Only 1-2 more masks are needed for vias and wire connections. In addition to TFTs, capacitors can be made with the gate insulator and the electrode layers under and above. Resistors can be made with the semiconductor metal oxide. The pixilated imager disclosed in this invention can thus be generalized as comprising image pixels comprising a radiation element plus an image readout circuit incorporated in or with the metal oxide TFT.

It will be understood that the TFT pixel electronics can be made transparent with transparent data lines and gate scan lines (lines to gates 30, not visible). Transparent data lines and gate scan lines are especially important for high density imagers where the pixels are very small and the fill factor can become very small if opaque data lines and gate scan lines are used. It should also be noted that arrays incorporating active pixels or passive pixels are both possible when using the present invention.

Although a top-sensing configuration is used in describing the method of fabrication and the structure of the pixilated image array, the same structure and configuration can be used for bottom-sensing imagers as well. For the same device to be used for bottom-sensing or even bi-directional sensing, the bottom electrode and the substrate are formed of material transparent to the wavelength range it is desired to sense. When needed, the substrate can also be thinned to a desired thickness substantially smaller than the dimensions of the image pixels. By combining the functions of top-sensing and bottom-sensing, an image array with radiation sensitivity from both sides can be achieved.

With the device structure and process flow, a sensor array with multiple detection bands (such as visible and infrared) can also be achieved. For example, a dual-band sensor array with image element in p-i1-n-i2-p or n-i1-p-i2-n form can be fabricated. This image element essentially forms two p-i-n diodes coupled in series. In this structure the detection band can be selected by flipping the biasing polarity between the bottom electrode and the top electrode. In this biasing scheme, one p-i-n diode is selected or connected in reverse biasing and sensing mode while the other one is connected in a forward biasing mode, thereby providing a conductive path. In addition to the vertical arrangement described, the multiple band sensing elements can alternatively or additionally be arranged in the same latitude. The band selection can be accomplished by means of a selection switch that flips the bias on all of the dual band sensor elements in the dual-band sensor array.

Thus, the present invention provides new and improved processes for fabricating a top illumination-bottom imager with a MOTFT array. The new and improved processes for fabricating an imager use a fewer number of process steps and are simple to perform. Also, the new and improved processes for fabricating an imager substantially reduce coupling capacitance between data lines and scan lines and the common electrode. Further, a new and improved process for fabricating large area imagers is disclosed the present invention provides new and improved imagers and especially large area imagers.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a pixelated imager comprising the steps of:
   providing a substrate with a bottom contact layer and sensing element blanket layers deposited or grown on the bottom contact layer;
   separating the sensing element blanket layers into an array of sensing elements with trenches isolating adjacent sensing elements in the array;
   forming a gate electrode adjacent each sensing element in the array, each gate electrode overlying an isolating trench and defining a Thin Film Transistor (TFT);
   forming a layer of metal oxide semiconductor material on a gate dielectric layer overlying the gate electrode of each TFT and on an exposed upper surface of the sensing element blanket layers defining the sensing element adjacent each TFT; and
   depositing a layer of source/drain metal on the layer of metal oxide semiconductor material of each TFT over an area surrounding the gate electrode and separating the layer of source/drain metal into S/D electrodes on opposite sides of the gate electrode, the metal forming one of the S/D electrodes being in electrical contact with the metal oxide semiconductor material overlying the exposed upper surface of the sensing element blanket layers of the adjacent sensing element, whereby each sensing element in the array is electrically connected to the adjacent TFT by the metal oxide semiconductor material.

2. A method as claimed in claim 1 wherein the pixelated imager is fabricated to be sensitive to one of top illumination, bottom illumination, or both top illumination and bottom illumination.

3. A method as claimed in claim 2 wherein the substrate and bottom contact layer are transparent to sensing wavelengths of the sensing elements.

4. A method as claimed in claim 1 wherein the step of forming the gate electrode includes planarizing the trenches before depositing the gate electrodes.

5. A method as claimed in claim 1 wherein the step of forming the layer of metal oxide semiconductor material includes forming a layer of metal oxide semiconductor material that is transparent to sensing wavelengths of the sensing elements.

6. A method as claimed in claim 3 wherein the step of forming the layer of metal oxide semiconductor material with the transparent metal oxide semiconductor material includes a transparent metal oxide semiconductor material that is one of amorphous or polycrystalline.

7. A method as claimed in claim 1 wherein the step of forming the gate electrode adjacent each sensing element in the array includes forming data lines and gate scan lines overlying the isolating trenches.

8. A method as claimed in claim 1 wherein the step of depositing the layer of source/drain metal includes forming a layer of etch stop material to define an active area in the metal oxide semiconductor material overlying the gate electrode.

9. A method as claimed in claim 8 wherein the step of forming a layer of etch stop material includes forming a portion on the upper surface of the metal oxide semiconductor material on the upper surface of the sensing element blanket layers defining a sensing element adjacent each TFT.

10. A method as claimed in claim 1 wherein the step of providing the sensing element blanket layers includes providing p-n photodiode blanket layers deposited or grown on the bottom contact layer and the step of separating the sensing element blanket layers into the array of sensing elements includes separating the p-n photodiode blanket layers into an array of photodiodes with trenches isolating adjacent photodiodes in the array.

11. A method as claimed in claim 10 wherein the step of providing the substrate with the p-n junction blanket layers includes providing a lower layer of semiconductor material having one of p-type and n-type conductivity and an overlying layer of semiconductor material having the other of n-type and p-type conductivity forming a p-n junction.

12. A method as claimed in claim 11 wherein the step of providing a lower layer of semiconductor material and an overlying layer of semiconductor material includes depositing a layer of intrinsic material between the lower layer and the upper layer to form a PIN diode.

13. A method as claimed in claim 11 wherein the step of providing the substrate with the p-n junction blanket layers includes providing blanket layers including one of p-i1-n-i2-p layers or n-i1-p-i2-n layers.

14. A method of fabricating a top illumination-bottom imager comprising the steps of:
   providing a substrate and forming a bottom electrode layer on the substrate;
   depositing or growing at least a lower semiconductor layer and an overlying upper semiconductor layer on the bottom electrode to form a p-n junction blanket layer overlying the bottom electrode layer;
   using a first masking step separating the upper semiconductor layer of the p-n junction blanket layer into an array of photodiodes with trenches isolating adjacent photodiodes in the array;
   planarizing the array of photodiodes with a dielectric material;
   using a second masking step forming a gate electrode defining a TFT adjacent each photodiode of the array of photodiodes, each of the gate electrodes overlying an isolating trench;
   depositing or growing a layer of gate dielectric on the photo diode array, and using a third masking step removing portions of the layer of gate dielectric to expose an upper surface of the upper semiconductor layer of each photodiode in the array of photodiodes;
   using a fourth masking step depositing or growing a layer of metal oxide semiconductor material on the gate dielectric layer overlying the gate electrode of each TFT and the exposed upper surface of the upper semiconductor layer of each photodiode in the array of photodiodes;
   using a fifth masking step depositing a layer of etch stop material overlying the gate electrode of each TFT and the layer of metal oxide semiconductor material overlying the exposed upper surface of the upper semiconductor layer of each photodiode; and
   using a sixth masking step depositing a layer of source/drain metal on each TFT over an area surrounding the gate electrode and separating the layer of source/drain metal into electrodes on opposite sides of the gate electrode, the metal forming one of the source/drain electrodes being in electrical contact with the metal oxide semiconductor material overlying the exposed upper surface of the upper semiconductor layer of the adjacent photodiode.

15. A method as claimed in claim 14 wherein the step of depositing or growing at least the lower semiconductor layer and the overlying upper semiconductor layer on the bottom electrode includes depositing a layer of intrinsic material between the lower layer and the upper layer to form a PIN diode.

16. A method as claimed in claim 15 wherein the step of separating the upper semiconductor layer of the p-n junction blanket layer into an array of photodiodes with trenches includes forming the trenches through a portion of the layer of intrinsic material.

17. A method as claimed in claim 14 wherein the step of forming the gate electrode defining the TFT adjacent each photodiode includes forming data lines and gate scan lines overlying the isolating trenches.

18. A method as claimed in claim 14 wherein the step of depositing or growing the layer of metal oxide semiconductor material includes forming a layer of metal oxide semiconductor material that is transparent to sensing wavelengths of the sensing elements.

19. A method as claimed in claim 18 wherein the step of depositing the layer of transparent metal oxide semiconductor material includes depositing a transparent metal oxide semiconductor material that is one of amorphous or polycrystalline.

20. A method as claimed in claim 14 wherein the step of planarizing the array of photodiodes with the dielectric material includes a coating process using one of polymer PMGI, polystyrene, PMMA, or other type acrylic polymer, Polyethylene, polyimide, polyvinyl phenol (PVP), zeon, PET, PEN, PES, PAN, BCB, SU8, silane- or siloxy-lane based, metallo-organic based compounds, spin on glasses, or grapheme oxides.

21. A structure including a pixelated imager comprising:
a substrate with a bottom contact layer and sensing element blanket layers deposited on the bottom contact layer;
the sensing element blanket layers being separated into an array of sensing elements with trenches isolating adjacent sensing elements in the array;
a gate electrode adjacent each sensing element in the array, each gate electrode overlying an isolating trench and defining a TFT;
a layer of metal oxide semiconductor material positioned on a dielectric layer overlying the gate electrode of each TFT and on an exposed upper surface of the sensing element blanket layers defining the sensing element adjacent each TFT; and
a layer of source/drain metal positioned on each TFT over an area surrounding the gate electrode and separated into source/drain electrodes on opposite sides of the gate electrode, the metal forming one of the source/drain electrodes being in electrical contact with the metal oxide semiconductor material overlying the exposed upper surface of the upper layer of the adjacent sensing element, whereby each sensing element in the array is electrically connected to the adjacent TFT by the metal oxide semiconductor material.

22. A structure as claimed in claim 21 wherein the sensing element blanket layers include a lower semiconductor layer an overlying upper semiconductor layer and a layer of intrinsic material between the lower layer and the upper layer forming a PIN diode sensing element.

23. A structure as claimed in claim 21 wherein the sensing element blanket layers include p-n photodiode blanket layers positioned on the bottom contact layer and the p-n photodiode blanket layers are separated into an array of photodiodes with trenches isolating adjacent photodiodes in the array.

24. A structure as claimed in claim 23 wherein the p-n junction blanket layers include a lower layer of semiconductor material having one of p-type and n-type conductivity and an overlying layer of semiconductor material having the other of n-type and p-type conductivity forming a p-n junction.

25. A structure as claimed in claim 24 wherein the p-n junction blanket layers including the lower layer of semiconductor material and the overlying layer of semiconductor material further include a layer of intrinsic material between the lower layer and the upper layer to form a PIN diode.

26. A structure as claimed in claim 24 wherein the p-n junction blanket layers include one of p-i1-n-i2-p layers or n-i1-p-i2-n layers.

27. A structure as claimed in claim 21 wherein the sensing element blanket layers separated into an array of sensing elements with trenches includes the trenches extending through a portion of the layer of intrinsic material.

28. A structure as claimed in claim 21 wherein the gate electrode adjacent each sensing element and overlying an isolating trench further includes data lines and gate scan lines overlying the isolating trenches.

29. A structure as claimed in claim 28 wherein a planarizing layer is positioned in the trenches beneath the gate electrode and the data lines and gate scan lines.

30. A structure as claimed in claim 29 wherein the planarizing layer includes a coating of one of polymer PMGI, polystyrene, PMMA, or other type acrylic polymer, Polyethylene, polyimide, polyvinyl phenol (PVP), zeon, PET, PEN, PES, PAN, BCB, SU8, silane- or siloxy-lane based, metallo-organic based compounds, spin on glasses, or grapheme oxides.

31. A structure as claimed in claim 21 wherein the layer of metal oxide semiconductor material includes a layer of metal oxide semiconductor material that is transparent to sensing wavelengths of the sensing elements.

32. A structure as claimed in claim 31 wherein the transparent metal oxide semiconductor material includes one of amorphous or polycrystalline transparent metal oxide semiconductor material.

* * * * *